United States Patent [19]

Ueda

[11] Patent Number: 5,378,921

[45] Date of Patent: Jan. 3, 1995

[54] HETEROJUNCTION MULTICOLLECTOR TRANSISTOR

[75] Inventor: Shigeyuki Ueda, Kyoto, Japan

[73] Assignee: Rohm Co., Ltd., Kyoto, Japan

[21] Appl. No.: 952,079

[22] Filed: Sep. 28, 1992

[30] Foreign Application Priority Data

| Oct. 21, 1991 [JP] | Japan | 3-272444 |
| Oct. 24, 1991 [JP] | Japan | 3-277515 |
| Oct. 25, 1991 [JP] | Japan | 3-279073 |
| Oct. 30, 1991 [JP] | Japan | 3-285019 |

[51] Int. Cl.$^6$ .................. H01L 49/00; H01L 29/72
[52] U.S. Cl. ...................... 257/574; 257/76; 257/77; 257/566; 257/575
[58] Field of Search ............ 257/DIG. 77, 76, 566, 257/574, 575

[56] References Cited

U.S. PATENT DOCUMENTS

| 4,531,142 | 7/1985 | Weyrich et al. | 357/17 |
| 5,006,180 | 4/1991 | Kanai et al. | 136/258 |

FOREIGN PATENT DOCUMENTS

| 62-160761 | 7/1987 | Japan . |
| 1-55862 | 3/1989 | Japan . |
| 1-289163 | 11/1989 | Japan . |
| 0455397 | 2/1992 | Japan . |
| 0529331 | 2/1993 | Japan . |

Primary Examiner—Sara W. Crane
Assistant Examiner—Valencia M. Wallace
Attorney, Agent, or Firm—Lowe, Price, LeBlanc & Becker

[57] ABSTRACT

There is provided a high-speed heterojunction transistor which is excellent in heat and radiation resistances with its emitter injection efficiency improved due to heterojunction. A $\beta$ silicon carbide layer (44) acting as base region is grown on an $\alpha$ silicon carbide substrate (42) acting as emitter region. Due to the difference in forbidden band between the $\alpha$ silicon carbide substrate (42) and the $\beta$ silicon carbide layer (44), heterojunction can be obtained. Because the $\alpha$ silicon carbide substrate (42) has a wider forbidden band, emitter efficiency is improved, allowing a high-speed transistor to be realized. Further, the device is made of silicon carbide, it is excellent in heat and radiation resistances. This invention may be used in an embodiment in which a heterojunction bipolar transistor or a heterojunction IIL is manufactured.

6 Claims, 10 Drawing Sheets

F I G. 3
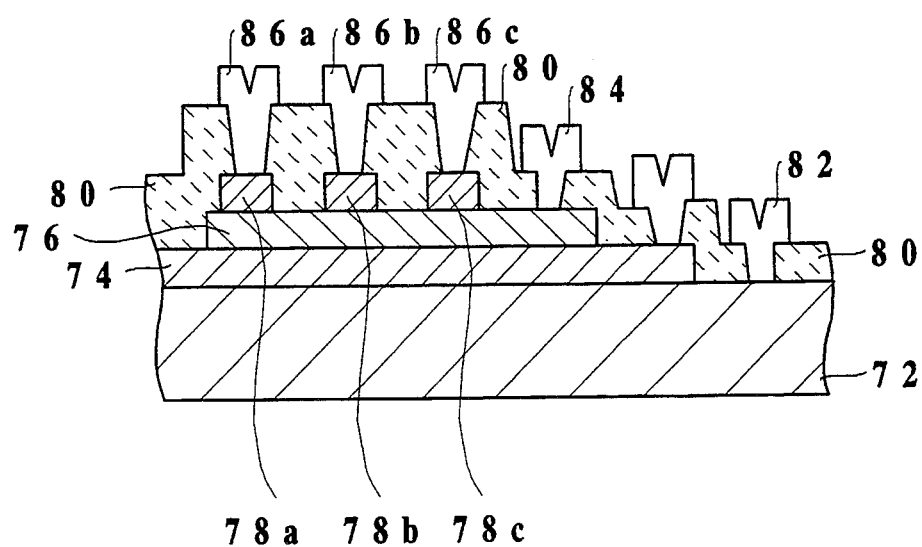

F I G. 5
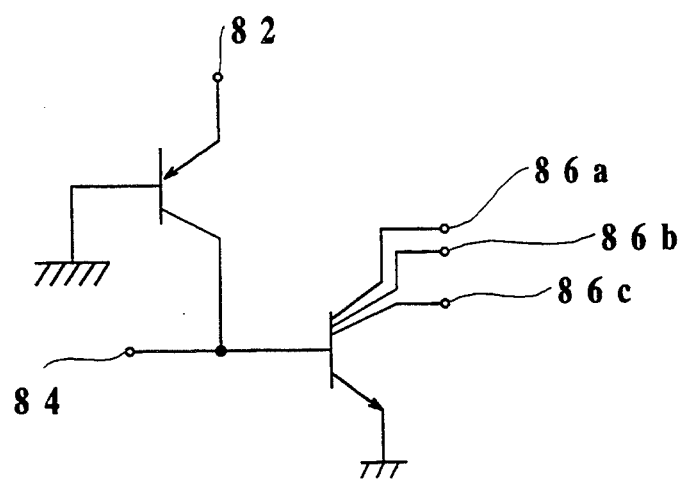

HETEROJUNCTION MULTICOLLECTOR TRANSISTOR

BACKGROUND OF THE INVENTION

1. Field of the Invention

The present invention relates to a heterojunction transistor and, more particularly, to the improvement in heat resistance, radiation resistance, degree of structural freedom, or the like.

2. Description of the Prior Art

In recent years, a transistor utilizing heterojunction have been noticed. This transistor uses an emitter material which has a wider forbidden band than a base material to thereby increase emitter injection efficiency and decrease base resistance. As a result, it is possible to realize a high-speed and high-gain transistor. In particular, the forbidden band of silicon carbide (2.2 to 3.3 eV) is wider as compared with that of silicon. Taking advantage of this property, a heterojunction transistor having an excellent emitter injection efficiency has been proposed.

A conventional heterojunction transistor which is described in Japanese laid open publication No. SHO 62-216364(P) is shown in FIG. 11. An N-type silicon substrate 12 is provided with a collector contact region 14 formed by ion implantation. An N-type collector region 2 is grown thereon. Ions are implanted into the surface of the collector region 2 to thereby form a P-type base region 4. Next, a $\beta$ silicon carbide layer is grown using low-pressure chemical vapor depression (LPCVD) method and then an N-type emitter region 6 is formed by ion implantation.

In FIG. 12, there is also shown a conventional heterojunction transistor which is disclosed in Japanese laid open publication No. SHO 63-202962(P). A P-type monocrystal silicon layer 26 acting as base region is formed on an N-type monocrystal silicon carbide layer 24 as emitter region. Further, N-type monocrystal silicon layers 30a, 30b and 30c as collector region are diffused thereon. Reference numerals 28 and 32 designate an emitter contact region and a base contact region, respectively.

In FIG. 13, there is shown an energy band of the transistor thus formed. In the figure, Ec, Ev and Ef are the lower end of a conduction band, the upper end of a valence band and the Fermi potential, respectively. In addition, black dots show electrons and white dots show holes. As known from the figure, the forbidden band in the emitter region is larger than that in the base region, so that emitter injection of holes is suppressed. This causes a base current to be reduced, with the result that the emitter injection efficiency improved. As a result, a high-speed and high-gain transistor can be realized.

However, the conventional heterojunction transistor described above has the following problems.

Silicon, which is used as a material for base and collector regions, is inferior in heat and radiation resistances. This leads to the problem that silicon is not usable over the temperature range of 300° C. or in the presence of a high level of radiation.

Another problem is as follows. In the abovementioned heterojunction transistor, the top layer can be arranged as collector region alone. If top layers (30a, 30b and 30c in FIG. 12) are arranged as emitter region, heterojunction cannot be obtained in the emitter region, making it impossible to improve the emitter injection efficiency.

OBJECTS AND SUMMARY OF THE INVENTION

An object of the present invention, therefore, is to overcome the aforementioned problems and provide a heterojunction transistor having excellent heat and radiation resistances.

Another object of the present invention is to provide a heterojunction transistor whose top layer can be arranged as either emitter or collector region.

According to a feature of the invention there is provided a heterojunction multicollector transistor comprising:

a first conductive type emitter region made of $\alpha$ silicon carbide;

a second conductive type base region made of $\beta$ silicon carbide, being formed so as to border on the emitter region; and a plurality of first conductive type collector region made of $\beta$ silicon carbide, being formed so as to border on the base region.

According to a further feature of the invention, there is provided a heterojunction multicollector transistor comprising:

a first conductive type emitter region made of $\alpha$ silicon carbide;

a second conductive type base region made of polycrystaline silicon carbide, being formed on the emitter region; and a plurality of first conductive type collector region made of polycrystaline silicon carbide, being formed on the base region.

According to a still further feature of the invention, there is provided a heterojunction IIL comprising:

a first conductive type emitter region of a first transistor, being made of $\beta$ silicon carbide;

a second conductive type emitter region of a second transistor, being made of $\alpha$ silicon carbide, being formed so as to border on a collector region of the first transistor;

a first conductive type base region of the second transistor, being made of $\beta$ silicon carbide, being formed so as to border on the emitter region of the second transistor; and a second conductive type collector region of the second transistor, being made of $\beta$ silicon carbide, being formed so as to border on the base region of the second transistor.

According to a still further feature of the invention, there is provided a heterojunction transistor comprising:

a monocrystal $\beta$ silicon carbide layer;

a polycrystaline silicon layer formed on the monocrystal $\beta$ silicon carbide layer; and a polycrystaline silicon carbide layer formed on the polycrystaline silicon layer.

According to a still further feature of the invention, there is provided a method for manufacturing a heterojunction multicollector transistor comprising the steps of:

forming a second conductive type base region made of $\beta$ silicon carbide on a first conductive type emitter region made of $\alpha$ silicon carbide; and forming a plurality of first conductive type collector region made of $\beta$ silicon carbide on the second conductive type base region made of β silicon carbide.

According to a still further feature of the invention, there is provided a method for manufacturing a heterojunction multicollector transistor comprising the steps of:

forming a second conductive type base region made of polycrystaline silicon carbide on a first conductive type emitter region made of α silicon carbide; and forming a plurality of first conductive type collector region made of polycrystaline silicon carbide on the second conductive type base region made of polycrystaline silicon carbide.

According to a still further feature of the invention, there is provided a method for manufacturing a heterojunction transistor comprising the steps of:

forming a polycrystaline silicon layer on a monocrystal silicon carbide layer; and forming a polycrystaline silicon carbide layer on the polycrystaline silicon layer.

While the novel features of the invention are set forth in a general fashion, particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 3 is a diagram showing the structure of a heterojunction IIL according to an embodiment of the present invention.

FIG. 5 is a circuit diagram of the heterojunction IIL of FIG. 3.

DESCRIPTION OF THE PREFERRED EMBODIMENT

In FIGS. 1A–1D, there is shown the manufacturing process of a heterojunction multicollector transistor having excellent heat and radiation resistances.

First, an N-type α silicon carbide substrate 42 is prepared. Here, α silicon carbide is such that the atomic arrangement thereof is not cubic. For instance, 6H-SiC, 4H-SiC, 15R-SiC, or the like belong to α silicon carbide.

Figure 1A:
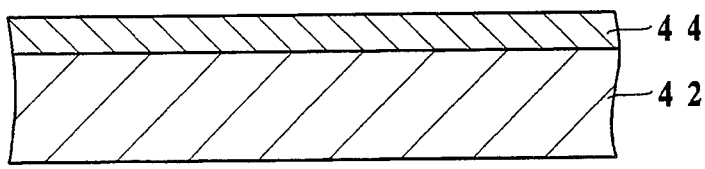
FIGS. 1A–1D are diagrams showing the manufacturing process of a heterojunction multicollector transistor according to an embodiment of the present invention.

A P-type β silicon carbide layer 44 as base region is grown on the N-type α silicon carbide substrate 42 by means of sublimation method (FIG. 1A). Here, β silicon carbide is such that the atomic arrangement thereof is cubic, namely 3C–SiC. In this embodiment, the β silicon carbide layer 44 is 1000 Å thick. The growth is performed at 1350° C. for five minutes by the use of disilane ($Si_2H_6$, 0.15 sccm), acetylene ($C_2H_2$, 0.15 sccm) and hydrogen ($H_2$, 3 slm).

Figure 1B:
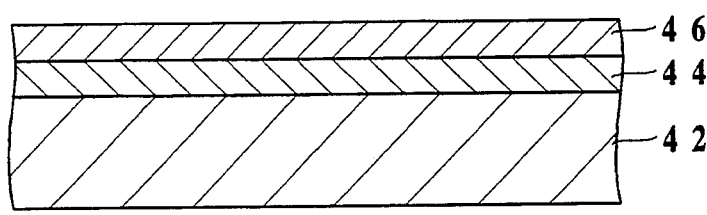

Further, by means of chemical vapor depression (CVD), an N-type β silicon carbide layer 46 as collector region is grown (FIG. 1B). In this embodiment, the β silicon carbide layer 46 is 2000 Å thick. The growth is performed in the same manner as described above except that the growth time is set for 10 minutes.

Figure 1C:
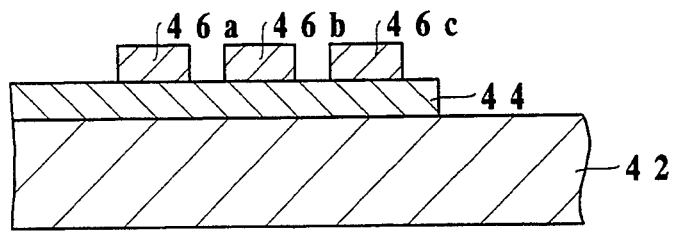

Thereafter, etching is performed as shown in FIG. 1C using lithography, so that the β silicon carbide layer 44 and the β silicon carbide layer 46 are partly removed. As a result, three collector regions 46a, 46b and 46c are obtained.

Figure 1D:
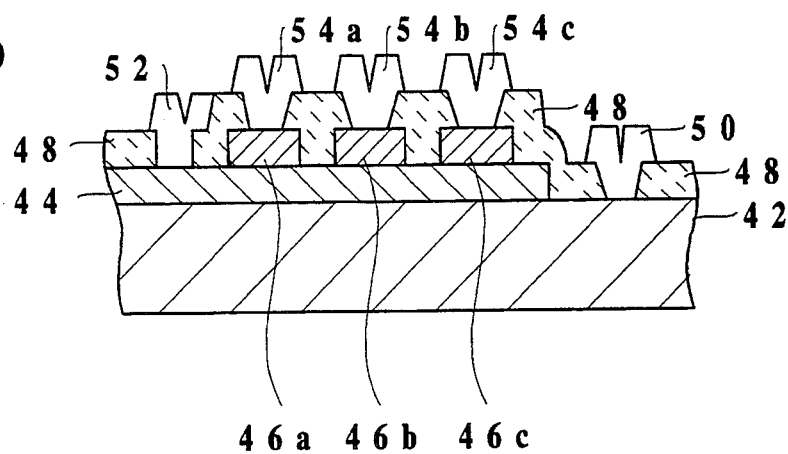

Next, the whole surface is oxidized to form a silicon dioxide layer 48, to which openings for electrodes are formed. Further, an emitter electrode 50, a base electrode 52 and collector electrodes 54a, 54b and 54c are formed in openings (FIG. 1D).

The heterojunction multicollector transistor can be obtained in such a manner as described above. In the heterojunction multicollector transistor according to the present invention, the emitter region is made of α silicon carbide and the base and collector regions are made of β silicon carbide. Accordingly, it is possible to provide a high-speed transistor having satisfactory emitter injection efficiency and excellent heat and radiation resistances. Such a transistor, therefore, may be used in engine rooms, nuclear reactors, artificial satellites, high frequency power transistors, or the like.

Further, because the β silicon carbide layer is formed on the α silicon carbide substrate, the above transistor can be readily manufactured.

Moreover, because the collector layer 54 is placed as a top layer, the multicollector transistor can be readily formed.

In a second embodiment, the manufacturing process of a heterojunction bipolar transistor having excellent heat resistance will be explained.

First, P-type polycrystaline silicon carbide is grown on a 6H-type β silicon carbide substrate by means of chemical vapor depression. Here, the 6H-type α silicon carbide substrate is arranged as N-type. Chemical vapor depression is carried out in such a way that the silicon substrate is placed in a furnace and is exposed to disilane ($Si_2H_6$) and acetylene ($C_2H_2$) as source gases and hydrogen ($H_2$) as a carrier gas. The growth is performed around 1000° C. for 20 minutes to obtain a layer of 1000 Å thickness. Boron, aluminum, or the like is used as P-type impurities.

Next, N-type polycrystaline silicon carbide is grown thereon by chemical vapor depression in a similar way.

Phosphorus or nitrogen is used as N-type impurities. Thereafter, etching is carried out using lithography. Further, a dioxide layer is formed on the whole surface. The dioxide layer is provided with an opening for an electrode formed by etching utilizing lithography.

Next, a metal electrode (Al—Si or the like) is deposited on the opening. The NPN-type bipolar transistor thus formed is made up of the emitter of 6H-type silicon carbide, the base of P-type polycrystaline silicon carbide and the collector of N-type polycrystaline silicon carbide.

Figure 2:
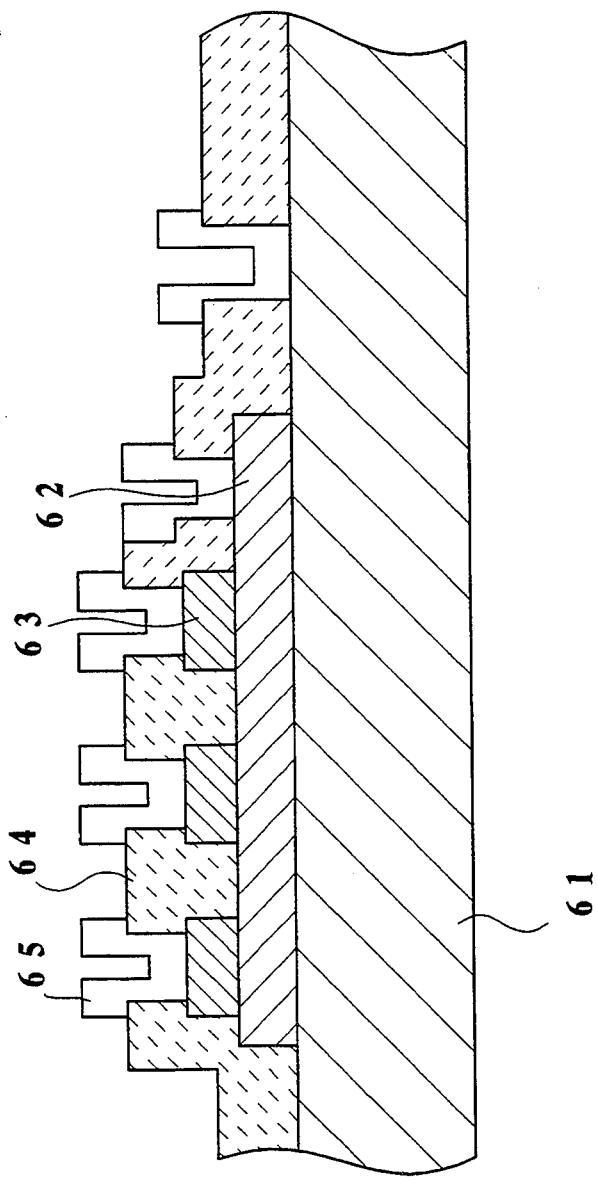
FIG. 2 is a diagram showing the structure of a heterojunction bipolar transistor according to an embodiment of the present invention.

In the manufacturing process described above, it is possible to grow polycrystaline silicon carbide by selective growth using $\alpha$ silicon dioxide layer as a mask. Also, a multicollector bipolar transistor can be formed by forming a plurality of collectors, as shown in FIG. 2.

In a third embodiment, the manufacturing process of a heterojunction multicollector IIL having excellent heat and radiation resistance will be explained in accordance with FIG. 3 and FIGS. 4A–4D.

First, an $\alpha$ silicon carbide substrate 72 acting as emitter region is prepared.

Figure 4A:
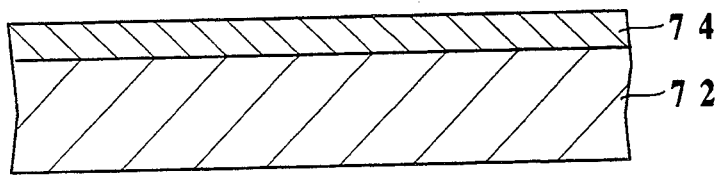
FIGS. 4A–4D are diagrams showing the manufacturing process of the heterojunction IIL of FIG. 3.

Next, an N-type $\alpha$ silicon carbide layer 74 is grown on the $\alpha$ silicon carbide substrate 72 by chemical vapor depression (FIG. 4A). The N-type $\alpha$ silicon carbide 74 layer thus formed acts as emitter region of a second transistor (base region of a first transistor). In this embodiment, the $\alpha$ silicon carbide layer 74 is 1000 Å thick. The growth is performed at 1500° C. by the use of silane (SiH$_4$, 0.15 sccm), propane (C$_3$H$_8$, 0.3 sccm) and a hydrogen gas as a carrier gas. Phosphorus ions are also added using phosphine (PH$_3$) to thereby arrange the $\alpha$ silicon carbide layer 74 as P-type.

Figure 4B:
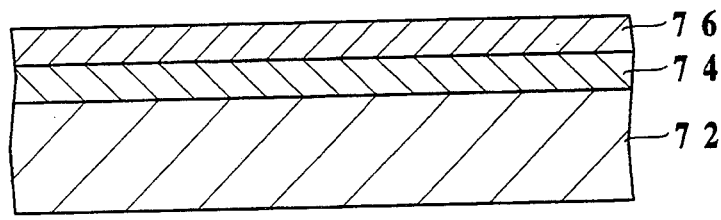

Further, a P-type $\beta$ silicon carbide layer 76 is grown thereon by means of sublimation method (FIG. 4B). The P-type $\beta$ silicon carbide layer 76 acts as base region of the second transistor (collector region of the first transistor). In this embodiment, the $\beta$ silicon carbide layer 76 is 1000 Å thick. The growth is performed at 1350° C. by the use of disilane (Si$_2$H$_6$, 0.15 sccm), acetylene (C$_2$H$_2$, 0.15 sccm) and a hydrogen gas as a carrier gas. Aluminum ions are also added by means of trimethylamine (TMA) bubbling to thereby arrange the $\beta$ silicon carbide layer 76 as N-type.

Figure 4C:
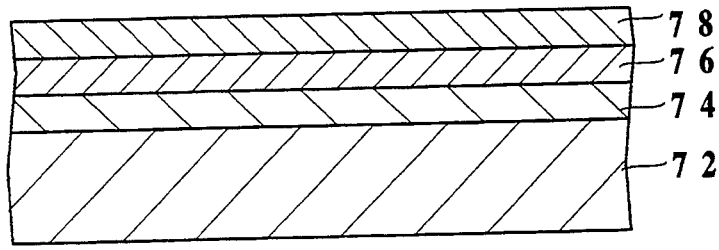

Still further, by chemical vapor depression, an N-type $\beta$ silicon carbide layer 78 is grown as collector region of the second transistor (FIG. 4C). In this embodiment, the $\beta$ silicon carbide layer 78 is 1000 Å thick.

Figure 4D:
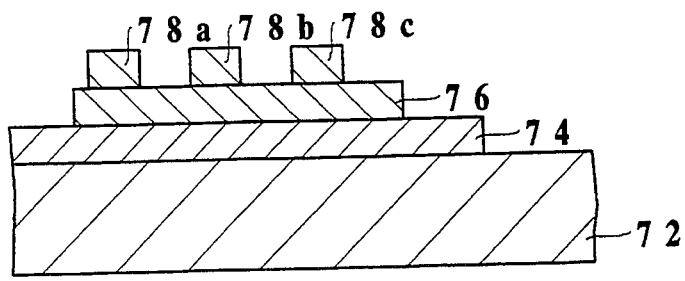

Thereafter, using lithography, etching is carried out as shown in FIG. 4D so as to partly remove the $\alpha$ silicon carbide layer 74, the $\beta$ silicon carbide layer 76 and the D silicon carbide layer 78. As a result, three collector regions 78a, 78b and 78c are obtained.

Next, the whole surface is oxidized to form a silicon dioxide layer 80, to which openings for electrodes are formed. Further, an injector electrode 82, a base electrode 84 and collector electrodes 86a, 86b and 86c are formed in openings.

As described above, the heterojunction multicollector IIL which is shown in FIG. 5 in a circuit diagram can be obtained. In the heterojunction multicollector IIL according to the present invention, the emitter region is made of $\alpha$ silicon carbide and the base and collector regions are made of $\beta$ silicon carbide. Accordingly, it is possible to provide a high-speed IIL having satisfactory emitter injection efficiency and excellent in heat and radiation resistances. Such an IIL, therefore, may be used in engine rooms, nuclear reactors, artificial satellites, high frequency power transistors, or the like.

Further, because the $\beta$ silicon carbide layer is formed on the $\alpha$ silicon carbide substrate, the above transistor can be readily manufactured.

Moreover, because the collector layer 86 is placed as a top layer, the multicollector transistor can be readily formed.

Figure 6:
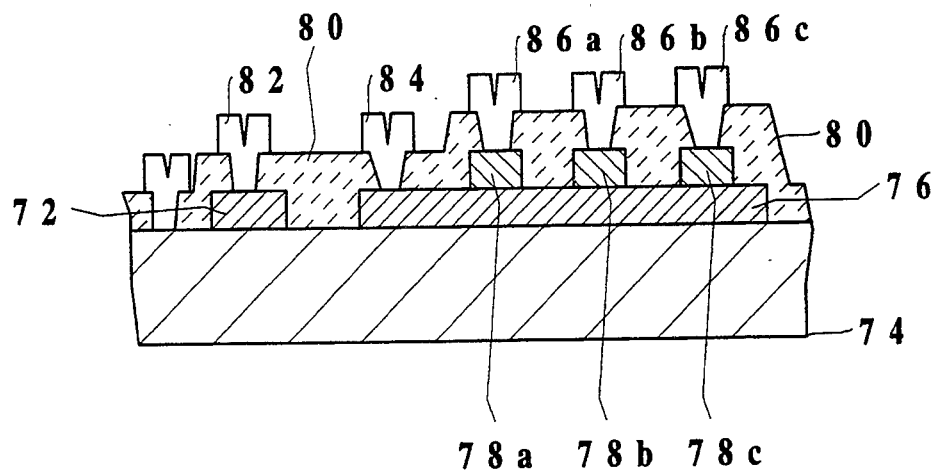
FIG. 6 is a diagram showing the structure of a heterojunction IIL according to another embodiment of the present invention.

A heterojunction multicollector IIL according to another embodiment of the present invention is shown in FIG. 6. In this embodiment, the $\alpha$ silicon carbide substrate 74 is used as the emitter region of the second transistor, on which the $\alpha$ silicon carbide layer 72 and the $\beta$ silicon carbide layer 76 are formed separately.

Figure 7:
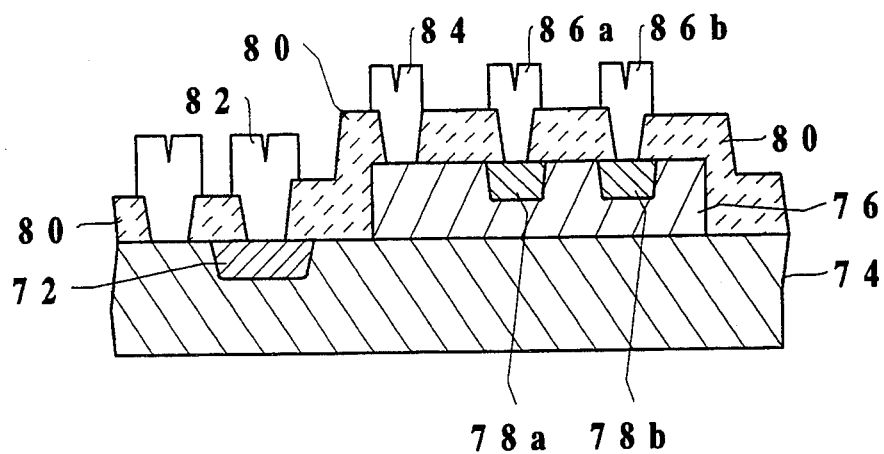
FIG. 7 is a diagram showing the structure of a heterojunction IIL according to a further embodiment of the present invention.

Also, as shown in FIG. 7, the $\alpha$ silicon carbide layer 72 and $\beta$ silicon carbide layers 78a and 78b are formed by ion implantation using a resist pattern.

Although a multicollector transistor is explained in each embodiment, it is possible that the invention may be used in an embodiment in which a single collector is formed.

In FIGS. 8A–8D, there is shown a method for manufacturing a heterojunction transistor which allows the top layer of a transistor to be arranged as either a collector or an emitter according to a further embodiment of the present invention.

Figure 8A:
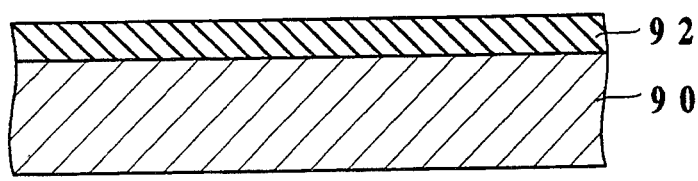
FIGS. 8A–8D are diagrams showing the manufacturing process of a heterojunction transistor according to an embodiment of the present invention.

First, a monocrystal $\beta$ silicon carbide layer 92 is grown on a monocrystal silicon substrate 90 (FIG. 8A). The forbidden band of the monocrystal $\beta$ silicon carbide is approximately 2.2 eV.

In this embodiment, the monocrystal $\beta$ silicon carbide layer 92 is grown by chemical vapor depression. The monocrystal silicon substrate 90 is placed in a furnace and thereafter is exposed to disilane (Si$_2$H$_6$) and acetylene (C$_2$H$_2$) as source gases and hydrogen (H$_2$) as a carrier gas. The growth is performed for about 30 minutes to obtain the monocrystal $\beta$ silicon carbide layer 92 (N-type) of 6000 Å thickness.

Figure 8B:
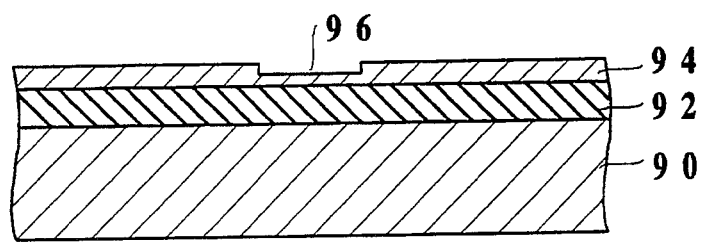

Next, by chemical vapor depression, a polycrystaline silicon layer 94 (P-type) is grown to an extent that the layer thereof becomes 2000 Å thick. Thereafter, etching is carried out using lithography to thereby form a recessed part 96 which acts as base region (FIG. 8B). This makes the layer under the recessed part 96 1000 Å thick.

Figure 8C:
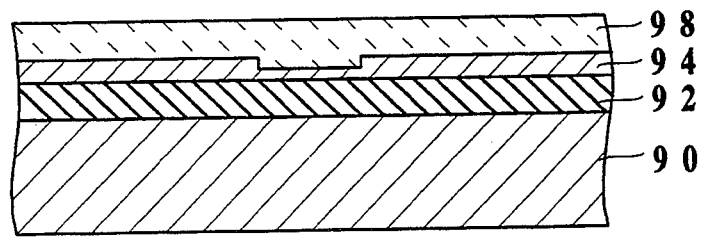

A polycrystaline silicon carbide layer 98 is grown on the polycrystaline silicon layer 94 by chemical vapor depression (FIG. 8C). In this embodiment, the substrate is placed in a furnace and is exposed to disilane and acetylene as source gases and hydrogen as a carrier gas. The growth is performed around 950° C. for about 50 minutes to obtain the polycrystaline silicon carbide layer 98 (N-type) of 3000 Å thickness.

Figure 8D:
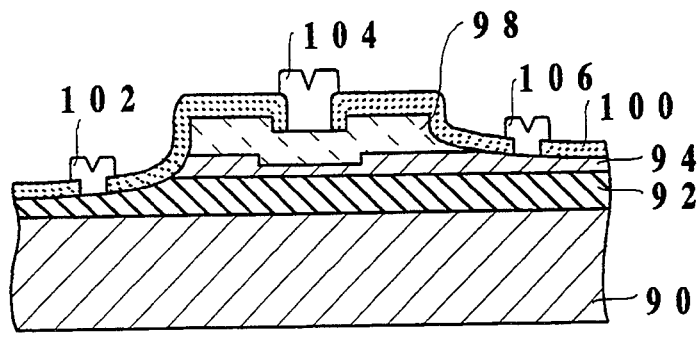

Next, etching is carried out using lithography to thereby emerge the monocrystal $\beta$ silicon carbide layer 92 and the polycrystaline silicon layer 94. A silicon dioxide layer 100 is grown on the whole surface and thereafter is provided with openings for use in forming electrodes 102, 104 and 106 (FIG. 8D).

In the transistor thus formed, heterojunction can be obtained in the emitter region in a case where one of the monocrystal $\beta$ silicon carbide layer 92 and the polycrystaline silicon carbide layer 98 is arranged as a collector and the other is arranged as an emitter. As a result, it is possible to freely arrange a top layer as a collector or an emitter. This means that the heterojunction transistor having high degree of structural freedom is provided according to the present invention.

Figure 9:
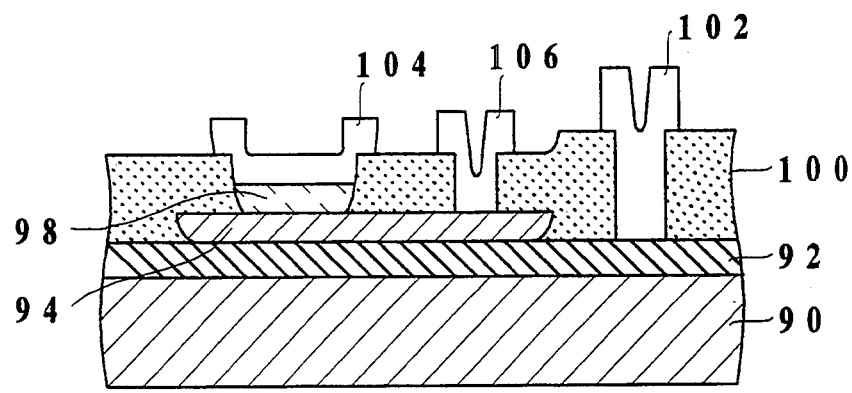
FIG. 9 is a diagram showing the structure of a heterojunction transistor according to another embodiment of the present invention.

In FIG. 9, there is shown a heterojunction transistor which is manufactured by selective growth method using the dioxide layer as a mask.

Figure 10:
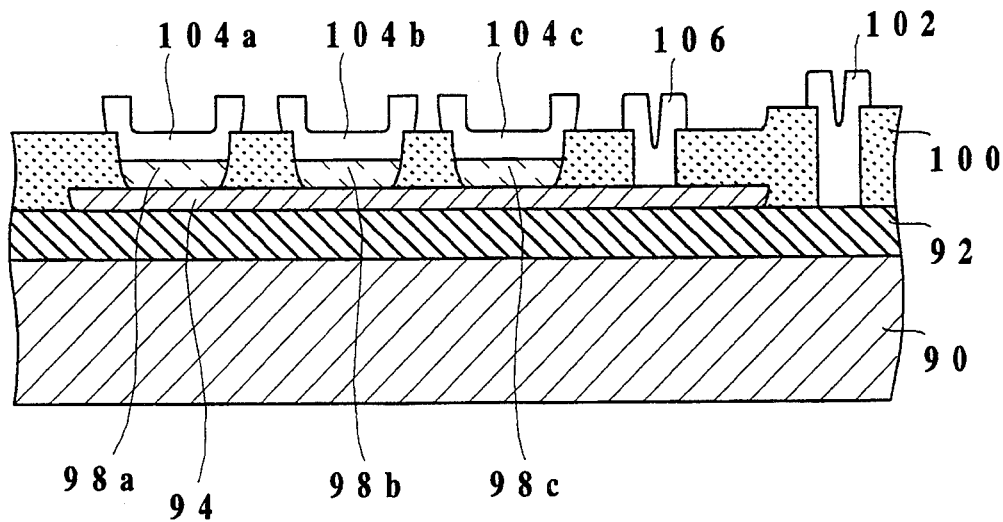
FIG. 10 is a diagram showing the structure of a heterojunction multicollector transistor according to another embodiment of the present invention.
Figure 11:
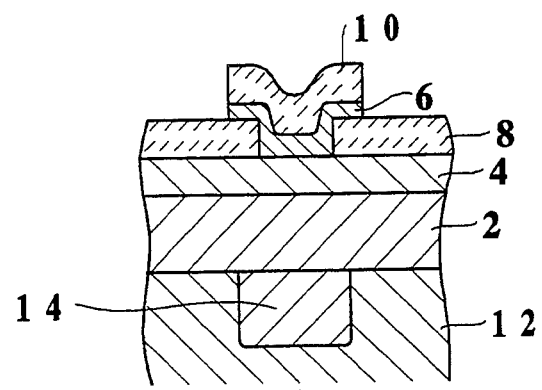
FIG. 11 is a diagram showing the structure of a conventional heterojunction transistor.
Figure 12:
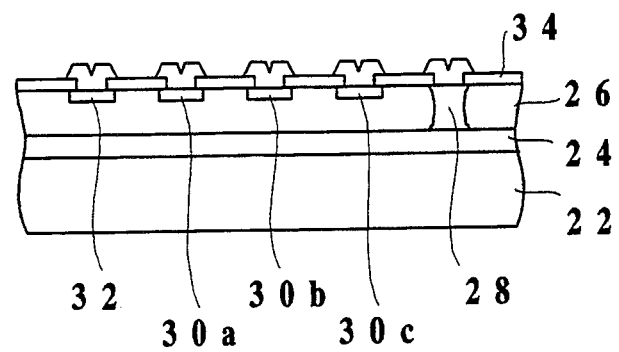
FIG. 12 is a diagram showing the structure of another conventional heterojunction transistor.
Figure 13:
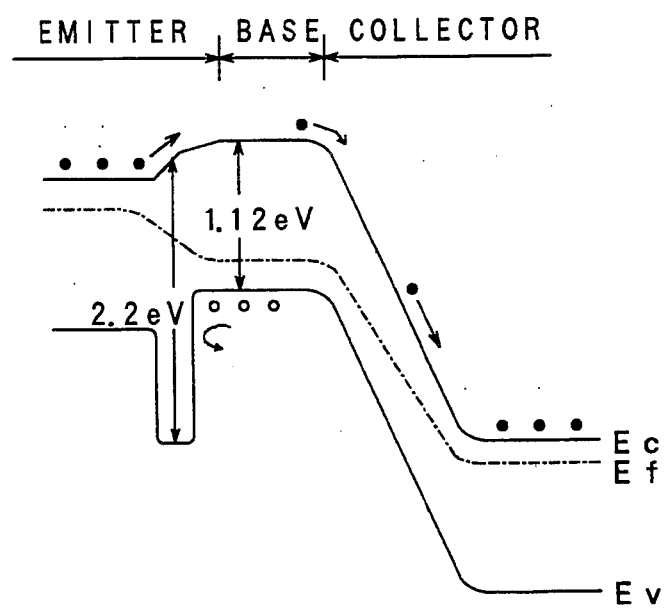
FIG. 13 is a diagram showing the energy band of a heterojunction transistor.

Also, a multicollector transistor can be obtained by forming a plurality of polycrystaline silicon carbide layers 98, as shown in FIG. 10.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:

1. A heterojunction multicollector transistor, comprising:
   a first conductive type emitter layer made of α silicon carbide;
   a second conductive type base layer made of β silicon carbide, formed in contact with and on the top of said emitter layer; and
   a plurality of first conductive type collector regions made of β silicon carbide, and formed in contact with and on the top of said base layer.

2. A heterojunction multicollector transistor, comprising:
   a first conductive type emitter layer made of α silicon carbide;
   a second conductive type base layer made of polycrystalline silicon carbide, formed in contact with and on the top of said emitter layer; and
   a plurality of first conductive type collector regions made of polycrystalline silicon carbide, formed in contact with and on the top of said base layer.

3. In an IIL in which a base of a first transistor and an emitter of a second transistor are shared, a collector of the first transistor and a base of the second transistor being shared, a heterojunction IIL, comprising:
   a first layer of a second conductive type forming an emitter of said second transistor and a base of said first transistor, being made of α silicon carbide, and
   a second layer of a first conductive type forming an emitter of said first transistor, being made of α silicon carbide, and formed on top of and in contact with said first layer;
   a third layer of a first conductive type forming a base of said second transistor and a collector of said first transistor, the third layer being made of β silicon carbide, and formed on top of and in contact with said first layer; and
   a fourth layer of a second conductive type forming a collector of said second transistor, the fourth layer being made of β silicon carbide, and formed on top of and in contact with said third layer.

4. A heterojunction transistor, comprising:
   a monocrystal β silicon carbide layer;
   a polycrystalline silicon layer formed in contact with and on top of the monocrystal β silicon carbide layer; and
   a polycrystalline silicon carbide layer formed on in contact with and on top of the polycrystalline silicon layer.

5. A heterojunction transistor as claimed in claim 4, wherein said monocrystal silicon carbide layer is arranged as emitter, said polycrystalline silicon layer being arranged as base, said polycrystalline silicon carbide layer being arranged as collector.

6. A heterojunction transistor as claimed in claim 4, wherein said monocrystal silicon carbide layer is arranged as collector, said polycrystalline silicon layer being arranged as base, said polycrystalline silicon carbide layer being arranged as emitter.

* * * * *